United States Patent [19]
Regnier

[11] Patent Number: 4,812,781
[45] Date of Patent: Mar. 14, 1989

[54] VARIABLE GAIN AMPLIFIER

[75] Inventor: Gerard S. Regnier, Scotts Valley, Calif.

[73] Assignee: Silicon General, Inc., San Jose, Calif.

[21] Appl. No.: 129,746

[22] Filed: Dec. 7, 1987

[51] Int. Cl.[4] ............................................. H03F 3/45
[52] U.S. Cl. ..................................... 330/254; 330/257
[58] Field of Search .......................... 330/69, 257, 254; 328/156, 158, 159; 307/498, 529

[56] References Cited

U.S. PATENT DOCUMENTS

| | | | |
|---|---|---|---|
| 3,786,200 | 1/1974 | Camenzind | 179/81 B |
| 4,536,888 | 8/1985 | Wilson | 381/106 |
| 4,555,673 | 11/1985 | Huijsing | 330/257 X |
| 4,599,572 | 7/1986 | Nakayama | 330/69 |

OTHER PUBLICATIONS

Brokaw, "Two Instrument ICS Sum Six Inputs", *Electronics*, Aug. 7, 1975, pp. 57, 98.
Fairchild A 706, A733, and A757.
Signetics NE/SE592.
Motorola Linear Integrated Circuit Data Book, Dec. 1971 MC1590G.
National Semiconductor publication Linear Applications, Feb. 1973, pp. AN15-2, AN31-9, AN31-15, AN32-5, and ANLB1-2.
RCA Application Note ICAN-6668, pp. 411-413.

*Primary Examiner*—James B. Mullins
*Attorney, Agent, or Firm*—Roth & Goldman

[57] ABSTRACT

A differential variable gain transconductance amplifier suitable for but not limited to applications requiring operation with a power supply of less than 1.0V. The circuit is suitable for fabrication by integrated circuit technology and is composed of three major blocks: an input stage, a current summing gain control stage, and an output stage. The differential input stage is comprised of two identical voltage-to-current converters, with one used as the positive input and the other as the negative input. The current summing stage uses the principal of summation of opposite but equal currents canceling to produce attenuated gain. The output stage converts current into voltage and produces a single ended output.

17 Claims, 1 Drawing Sheet

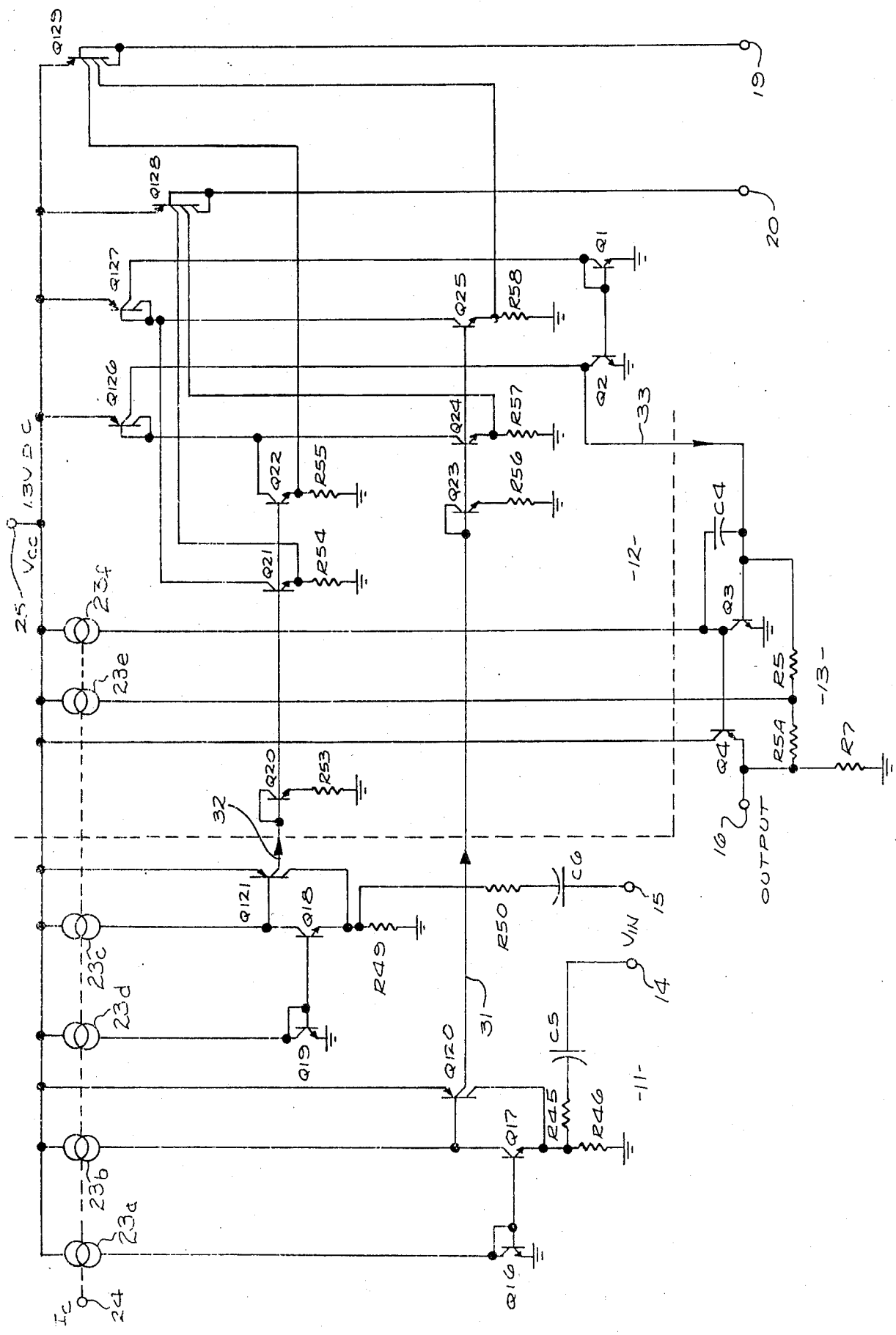

VARIABLE GAIN AMPLIFIER

BACKGROUND OF THE INVENTION

This invention relates to variable gain amplifiers, and in particular to a differential variable gain transconductance amplifier suitable for use in voice frequency circuits and especially adapted for operation with very low power supply voltage.

Voice frequency amplifiers are widely used in telephone circuitry and variable gain amplifiers are desired in some applications. A variety of amplifier circuits have been utilized for varying gain, and two such circuits are shown in U.S Pat. Nos. 3,786,200 and 4,536,888. Other circuits of this type are shown in the following integrated circuit catalog sheets: Fairchild A706, A733, and A757, Signetics NE/SE592, Motorola Linear Integrated Circuit Data Book, Dec. 1971 MC 1590G; the National Semiconductor publication Linear Applications, Feb. 1973, pages AN15-2, AN31-9, AN31-15, AN32-5 and LB1-2; and RCA Application Note ICAN-6668 pages 411–413.

One important characteristic of all amplifiers is the magnitude of the power supply voltage required for operating the circuits. It is an object of the present invention to provide a new and improved variable gain amplifier suitable for use with voice frequency circuits which can operate with a voltage source of less than one volt. The specific circuit described herein is designed for operation with a voltage supply 1.3 volts, readily available from a 1.5 volt battery. However the circuitry of the invention can be operated with a supply voltage as low as 0.9 v at 25° C. As junction temperature decreases, the lower operation supply voltage limit rises $\approx 2.2$ mv/°C. due to increasing base-emitter voltages.

Other objects, advantages, features and results will more fully appear in the course of the following description.

SUMMARY OF THE INVENTION

The amplifier of the present invention is a differential variable gain transconductance amplifier for amplification of voice frequency signals for providing an output within a controlled range with an input which may vary widely. The circuit provides a continuously variable gain which is controlled as a function of a gain control signal from a differential current source.

The presently preferred embodiment of the variable gain amplifier of the invnetion includes a differential input stage having two voltage-to-current converters, with one used for the positive input and the other for the negative input, for producing two current outputs, means for connecting a differential voltage to the inputs of the voltage-to-current converters, a current summing stage having a first pair of current inputs and a second pair of current inputs and including means for summation of opposite but equal currents canceling to produce attenuated gain at a current output, means for connecting the output currents of the input stage to the first pair of summing stage current inputs, another means for connecting a differential current source to the second pair of summing stage inputs as complimentary current sources, and an output stage having the summing stage current output as an input for converting current into voltage and producing the desired voltage output.

BRIEF DESCRIPTION OF THE DRAWING

The single FIGURE of the drawing is an electrical schematic of the presently preferred embodiment of the variable gain amplifier of the invention.

DESCRIPTION OF THE PREFERRED EMBODIMENT

The differential variable gain transconductance amplifier of the drawing has an input stage 11, a current summing gain control stage 12, and an output stage 13. A voice frequency input signal VIN is connected at terminals 14, 15, and the output signal appears at terminal 16 and circuit ground. A source of differential currents is connected at terminals 19, 20, and functions as the gain control signal provided as an input to Q128 and Q129. A number of constant current sources 23a through 23f are provided for some of the transistors, with a control current Ic connected at terminal 24. A DC supply is connected at terminal 25 to provide VCC for the transistors, typically 1.3 volts DC.

INPUT V/I CONVERTER CIRCUITS 11

The input stage 11 provides voltage-to-current conversion of the input signal VIN, and includes two opposite polarity sections. One section connected to input terminal 14 via C5 is composed of PNP current sources 23a, 23b, and current mirror Q16, Q17. Q120 forms a current feedback path as well as providing an output current source. Constant current source 23a provides a constant current to the collector-base connection of Q16 and to the base of Q17. The Q17 collector is also provided a current that is the same value as that going to Q16. The Q17 emitter size is physically ten times larger than that of Q16. Since Q16 and Q17 bases are connected in common and Q17 emitter is larger, Q17 is forced to operate at nearly ten times less current density than Q16. The differences in Vbe can be calculated by:

$$Vbe16 - Vbe17 = KT/q\ (\ln 10) \approx 60mV$$

There will be a small error in the calculated value due to the added base current of Q120. The emitter of Q17 forms a current summing node with R45, R46 and one of the collectors of Q120. The value of R46 is chosen so that approximately two times the current available from PNP current source 23b is required to maintain the 60 mV bias. The extra current is initially the base current into Q120. It is then multiplied by beta/2 (due to the split collectors of PNP Q120) and fed back to the emitter of Q17. After the emitter of Q17 rises to the required 60 mV stability point, the voltage at the emitter of Q17 is held constant by the current feedback loop of Q120.

In addition to holding the emitter voltage of Q17 constant, any current offset caused by current through R45 (such as from an input signal) is cancelled by an equal and opposite current from Q120. Thus, Q17, coupled with Q120, acts as a high gain inverting current amplifier that opposes any current change through R46. The current from the other collector of Q120 is, to a first approximation, identical to the fed back current to the summing node and serves as the output current of the V/I converter on line 31.

The opposite polarity input amplifier (Q18, Q121, R50, R49 along with source 23d, source 23c, Q19) is identical to the above described circuit and receives the complimentary signal from input terminal 15 and C6 and provides an output on line 32.

CURRENT SUMMING CIRCUITRY 12

Q24, Q25 act as current mirror outputs that replicate the output current of Q120. Q21, Q22 serve the same purpose for Q121. Q20 and Q23 are diode connected and receive their currents from Q121 and Q120, respectively.

The differential currents at terminals 19, 20 are applied as input to Q128, Q129, which in turn serve as complimentary current sources whose outputs drive currents into R54, R55 and R57, R58. The emitters of Q24 and Q25 form current summing nodes with R57, R58 and the complimentary current sources. The emitter current summing nodes of Q21 and Q22 are functionally the same as Q24, Q25.

The collector currents of Q24 and Q25 are determined by the following transcendental equations.

Summing the voltages around the loop formed by Q23, Q24, R57, R56 and neglecting base currents, yields:

$$Vbe\ Q24 + (IC128 + IE24)R57 - IE23R56 - Vbe\ Q23 = 0$$

Rearranging the equation and solving in terms of delta Vbe differences yields:

$$KT/q(\ln IE24/IE23) = IE23R56 - (IC128 + IE24)R57$$

and similarly:

$$Vbe\ Q25 + (IC129 + IE25)R58 - IE23R56 - Vbe\ Q23 = 0$$

$$KT/q(\ln IE25/IE23) = IE23R56 - (IE23 + IC129)R58$$

And of course the same applied for the loops formed by Q20, Q21 and Q22.

Since the emitters of Q24 and Q25 are connected to complimentary outputs of the differential current sources, their collector currents are also complimentary and range from almost equal to Q120 output current to nearly zero. Any AC change in collector current of Q23 gets mirrored in a non-linear manner by Q24 and Q25 due to the logarithm term in the above expression. The amount of non-linearity will be determined by the current differences between Q23 and Q24 or Q25. This current difference is controlled by Q128 and Q129.

The collectors of Q22 and Q24 are connected together to form a current summing node at the base of diode connected transistor Q126. Transistors Q25 and Q21 are similarly connected and form a complimentary summing node at the base of Q127. This summation of currents becomes the bias current for Q126 and Q127 current mirrors. The current biasing Q127 is mirrored to diode connected Q1, then mirrored back up by Q2.

The collector current of Q2 forms a summing node with the mirrored collector of Q126. The summation current at the collectors of Q126 and Q2 contain the differential input signal plus the products produced by the non-linear term of the above transcendental equations. The collector current of Q2 contains equal but opposite DC current as that of Q126. After these currents combine, the net DC current remaining to drive the base of Q3 is nearly zero. These currents also contain differential products caused by the non-linear term. These differential currents act to cancel differential offset currents that exist at the collectors of Q128 and Q129. The DC and distortion components also combine in opposition and cancel out, resulting in a clean replication on line 33 of the input signal at all gain settings.

OUTPUT I/V CONVERTER CIRCUIT 13

Q3 acts as an inverting amplifier. Q4 serves as an emitter follower output driver. Feedback is accomplished by R5 and R5A. Current source 23f serves as the collector load for Q3 and provides base current to Q4. The output signal is taken across output load resistor R7. Furthermore, the current that may be driven into or out of the current summing node at the base of Q3 by Q2 or Q126 will be compensated for by an opposing current through R5 (caused by a change in output voltage) in order to maintain Q3 base at the required base emitter voltage level. Therefore, the output voltage waveform will be a replica of the current unbalance of Q2 and Q126 at any instant of time. It will also be the same as the differential input waveform VIN modified by variable gain.

In the input stage 11, the differential input voltage signal is handled in two parallel circuits which perform voltage-to-current conversion of the voice frequency signal, providing complimentary outputs on lines 31, 32. In the current summing gain control stage 12, the differential current sources at terminals 19, 20 control the complimentary current sources Q128, Q129, providing currents to the summing nodes at the emitters of Q24, Q25 and Q21, Q22. The collectors of Q24, Q22 are connected to Q126 summing node and Q25, Q21 are similarly connected to Q127 in a cross connection pattern to achieve the desired current control. With this arrangement, differential gain control is achieved at the summing node at Q2 collector, providing a current output on line 33. The output stage 13 functions as a current-to-voltage converter providing the desired voltage output at terminal 16 which replicates the voltage input signal at terminals 14, 15, with the magnitude of the output within desired limits as a function of the gain control signal at terminals 19, 20.

It is preferred that the variable gain amplifier of the invention be produced as an integrated circuit on a single substrate, preferably by use of monolithic technology, with matched components throughout.

By way of example, the presently preferred values for the resistances and capacitances of the specific circuit of the drawing are as follows:

| R5 64.2K | R50 27K | |
|---|---|---|
| R5A 78.4K | R53 30K | C4 5 pf |
| R7 10K | R54 30K | C5 10 mf |
| R13 6.9K | R55 30K | C6 10 mf |
| R45 27K | R56 30K | |
| R46 2.68K | R57 30K | |
| R49 2.68K | R58 30K | |

With these values the current from each of the sources 23 is of a value so that the current through Q17 and current fed back from one of the collectors of Q120 are approximately equal. This balanced condition maximizes the circuits ability to handle large input voltages before saturation occurs. Of course, the same conditions apply for Q18 and Q121.

I claim:

1. A differential variable gain transconductance amplifier including in combination:

a differential voltage input stage including positive and negative inputs, two voltage-to-current converters and first and second outputs, with one converter being coupled to said positive input and the other converter being coupled to said negative input and with said two converters being of substantially identical structure, for producing two current outputs at said first and second outputs, respectively, with one of said two current outputs being of the same polarity and opposite in phase to the other one, responsive to voltage applied across said positive and negative inputs;

means for connecting a differential voltage across said positive and negative inputs of said differential voltage input stage;

a current summing stage including a first pair of current inputs, a second pair of current inputs, a current output, a plurality of current mirrors, and means for summation of opposite but equal currents cancelling to produce attenuated gain at said current output;

means for connecting said two outputs of said differential input stage to corresponding ones of said first pair of summing stage current inputs for applying current from said respective differential input stage outputs to said current summing stage;

means for connecting a differential current source to said second pair of summing stage inputs as complimentary current sources to provide a control current to said current summing stage;

said current summing stage being responsive to input current having a characteristic waveshape applied at said first pair of current summing stage inputs and further responsive to said control current inputted to said second pair of current summing stage inputs for producing an output current of a magnitude dependent upon said control current and of a waveshape that essentially replicates the wave shape of said voltage to current converters output currents as presented to said first pair of current inputs; and an output stage having said summing stage current output as an input for converting current into voltage and producing a voltage output that essentially replicates the shape of said differential voltage applied to said differential voltage input stage.

2. An amplifier as defined in claim 1 wherein each of said voltage-to-current converters includes:
an input for receiving a voltage to be converted to a corresponding current;
first and second transistors forming a current mirror; said current mirror having a current mirror input and a current mirror output;
current sources for each of said first and second transistors;
means defining a summing node connected to said current mirror input;
a third transistor providing a feedback path from said current mirror output to said summing node; and
circuit means connecting said input of said voltage-to-current converter to said summing node.

3. An amplifier as defined in claim 2 wherein each of said transistors includes a base, an emitter and a collector; and wherein said second transistor emitter is many times larger than said first transistor emitter so that the current density of said second transistor is many times less than that of said first transistor.

4. The amplifier as defined in claim 3 wherein said first and second transistors of said voltage to current converters are of the same polarity type and wherein said third transistor thereof is of a polarity type opposite to the polarity type of said first and second transistors.

5. The invention as defined in claim 4 wherein each of said voltage to current convertors includes:
first and second current source means for supplying essentially constant current to said first and second transistors, respectively.

6. An amplifier as defined in claim 2 wherein said current summing stage includes:
fourth and fifth transistors forming a first summing stage current mirror of said plurality of current mirrors, said first summing stage current mirror having as input one of said differential input stage voltage-to-current converter current outputs;
sixth and seventh transistors forming a second summing stage current mirror of said plurality of current mirrors, said second summing stage current mirror having as input the other of said differential input stage voltage-to-current converter current outputs;
each of said transistors containing at least one collector for conducting current;
means connecting one of said complimentary current sources to said fourth transistor of said first summing stage current mirror and to said sixth transistor of said second summing stage current mirror; and
means for connecting the other of said complimentary current sources to said fifth transistor of said first summing stage current mirror and to said seventh transistor of said second summing stage current mirror, with a current summing node at each such connection, and with the collector currents of said first summing stage current mirror transistors being complimentary and with the collector currents of said second summing stage current mirror transistors being complimentary.

7. An amplifier as defined in claim 6 further including:
an eighth transistor with said fifth transistor of said first summing stage current mirror and said sixth transistor of said second summing stage current mirror connected as a summing node;
a ninth transistor with said fourth transistor of said first summing stage current mirror and said seventh transistor of said second summing stage current mirror connected as a summing node; and
tenth and eleventh transistors interconnected with said eighth and ninth transistors for complimentary summation of currents to provide the current summing stage output current.

8. An amplifier as defined in claim 6 wherein said output stage includes:
an inverting amplifier having said current sensing stage current output as an input;
a driver amplifier having said inverting amplifier output as an input; and
a feedback circuit connecting said driver amplifier output as another input to said inverting amplifier, with the output voltage of said driver amplifier being a replica of said current summing stage current output.

9. The invention as defined in claim 2 wherein said circuit means comprises: a capacitance and a resistance in electrical series circuit.

10. A differential variable gain transconductance amplifier of the type containing an input and a gain control input and an output for producing an output signal voltage of a wave shape that is substantially identical to the wave shape of a differential signal voltage applied at an input and of a voltage level that is a function of the level of a gain control current applied to said gain control input including in combination:

a differential input stage having two voltage-to-current converters, with one of said voltage-to-current converters used for the positive input and the other one of said voltage-to-current converters for the negative input of a signal voltage, for producing first and second current outputs;

said voltage-to-current converters being of substantially identical construction and said first and second current outputs of said voltage-to-current converters being of like polarity and of opposite phase;

means for connecting a differential signal voltage to be amplified across the respective inputs of said voltage-to-current converters of said differential input stage;

a current summing stage for producing an output current, said current summing stage having a variable transconductance characteristic and including:

a first pair of current inputs for receiving input currents from said differential input stage, a second pair of current inputs for receiving differential current from a differential current source to control the gain of said current summing stage, and a current output;

means for connecting a differential current source to said second pair of summing stage inputs as complimentary current sources for controlling the gain of said amplifier;

means for connecting said first and second output currents of said voltage to current converters of said differential input stage to respective corresponding first and second inputs of said first pair of summing stage current inputs;

said current summing stage further including:

first, ssecond, third and fourth transistors, each of said transistors, including a base, emitter and at least one collector for conducting a collector current, said first and second transistors forming a first current mirror having as input one of said differential input stage voltage-to-current converter current outputs, said third and fourth transistors forming a second current mirror having as input the other of said differential input stage voltage-to-current converter current outputs, first control current means connecting one of said second pair of current summing stage inputs to said first transistor of said first current mirror and to said third transistor of said second current mirror to provide current to said first and third transistors, with a current summing node at each such connection, and second control current means for connecting the other input of said second pair of summing stage inputs to said second transistor of said first current mirror and to said fourth transistor of said second current mirror to provide current to said second and fourth transistors, with a current summing node at each such connection; said collector currents of said first and second transistors of said first current mirror being complimentary with respect to current supplied by said respective first and second control current means, and with the collector currents of said third and fourth transistors of said second current mirror being complimentary with respect to current supplied by said respective first and second control current means; and output stage means having said current summing stage current output as an input for converting current into a voltage to produce a voltage output that bears an essentially linear relationship to said differential voltage applied at said differential voltage input.

11. An amplifier as defined in claim 10 wherein said current summing stage further includes:

fifth, sixth, seventh and eighth transistors, each of said transistors including a base, emitter and at least one collector for conducting collector current;

said fifth transistor being connected by a collector and base thereof with said first transistor of said first current mirror and said fourth transistor of said second current mirror as a summing node with the collector current of said first transistor of said first current mirror and the collector current of said fourth transistor of said second current mirror being complimentary;

said sixth transistor being connected by a collector thereof with said second transistor of said first current mirror and said third transistor of said second current mirror connected as a summing node with the collector current of said second transistor of said first current mirror and the collector current of said third transistor of said second current mirror being complimentary; and said seventh and eighth transistors being interconnected, respectively, with said fifth and sixth transistors and said seventh and eighth transistors also being interconnected with one another for complimentary summation of currents at the collector of said eighth transistor to provide the current summing stage output current.

12. An amplifier as defined in claim 11 wherein said output stage includes:

an inverting amplifier having said current summing stage current output as an input;

a driver amplifier having said inverting amplifier output as an input; and a feedback circuit connecting said driver amplifier output as another input to said inverting amplifier, with the output voltage of said driver amplifier being a replica of said current summing stage current output.

13. The invention as defined in claim 11 wherein said seventh and eighth transistors each include a base, collector and emitter;

means connecting a collector of said fifth transistor to said collector and base of said seventh transistor and to said base of said eighth transistor;

means connecting said collector of said eighth transistor to a collector of said sixth transistor and to said current summing stage output; and means connecting said emitters of said seventh and eighth transistors to electrical ground potential.

14. An amplifier as defined in claim 10 wherein said current summing stage further includes:

fifth, sixth, seventh and eighth transistors, each of said transistors including a base, emitter and at least one collector for conducting collector current;

said fifth transistor forming a third current mirror having a current mirror output and being connected with said first transistor of said first current mirror and said fourth transistor of said second current mirror as a summing node with the collector current of said first transistor of said first current mirror and the collector current of said fourth transistor of said second current mirror being complimentary;

said sixth transistor forming a fourth current mirror having a current mirror output and being connected with said second transistor of said first current mirror and said third transistor of said second current mirror connected as a summing node with the collector current of said second transistor of said first current mirror and the collector current of said third transistor of said second current mirror being complimentary;

said seventh transistor being connected with said current mirror output of said third current mirror; and said eighth transistor being connected with said said current mirror output of said fourth current mirror and with said seventh transistor for complimentary summation of currents at the collector of said eighth transistor to provide the current summing stage output current.

15. A differential variable gain transconductance amplifier including in combination:
a differential input stage including first and second voltage-to-current converters, with one used for the positive input and the other for the negative input, for producing first and second output currents,
each of said voltage-to-current converters further including:
first and second transistors forming a current mirror having an input and an output,
current sources for each of said first and second transistors,
means defining a summing node connected to said current mirror input,
a third transistor providing a feedback path from said current mirror output to said summing node, and
circuit means connecting an input of said voltage-to-current converter to said summing node;
means for connecting a differential voltage to the inputs of said voltage-to-current converters;
a current summing stage having a first pair of current inputs, a second pair of current inputs and a current output;
means for connecting said first and second output currents of said differential input stage to respective ones of said first pair of summing stage current inputs;
means for connecting a differential current source to said second pair of summing stage inputs as complimentary current sources for providing selected levels of differential current thereto;
said current summing stage further including:
fourth and fifth transistors forming a second current mirror having as input one of said differential input stage voltage-to-current converter current outputs,
sixth and seventh transistors forming a third current mirror having as input the other of said differential input stage voltage-to-current converter current outputs,
means for connecting one of said complimentary current sources to one of said fourth and fifth transistors of said second current mirror and to one of said sixth and seventh transistors of said third current mirror,
means for connecting the other of said complimentary current sources to the other of said fourth and fifth transistors of said second current mirror and to the other of said sixth and seventh transistors of said third current mirror, with a current summing node at each such connection, and with the collector currents of said second current mirror transistors being complimentary and with the collector currents of said third current mirror transistors being complimentary,
an eighth transistor with said other transistor of said second current mirror and said one transistor of said third current mirror connected as a summing node,
a ninth transistor with said one transistor of said second current mirror and said other transistor of said third current mirror connected as a summing node, and
tenth and eleventh transistors interconnected with said eighth and ninth transistors for complimentary summation of currents to provide the current summing stage output current;
each of said transistors including an emitter, base and at least one collector for conducting current; and
an output stage having said summing stage current output as an input for converting current into voltage and producing a voltage output.

16. An amplifier as defined in claim 15 wherein said second transistor emitter is substantially larger than said first transistor emitter so that the current density of said second transistor is substantially less than that of said first transistor.

17. The invention as defined in claim 15 further including:
twelfth and thirteenth transistors, each of said twelfth and thirteenth transistors including a base, emitter and collector;
said base and collector of said twelfth transistor being connected to a first input of said first pair of current summing stage inputs and being connected to said fifth transistor, and said emitter of said twelfth transistor being connected through a resistor to electrical ground potential; and
said base and collector of said thirteenth transistor being connected to a second input of said first pair of current summing stage inputs and being connected to said seventh transistor, and said emitter of said thirteenth transistor being connected through a resistor to electrical ground potential.

* * * * *